(12) United States Patent
Kinoshita

(10) Patent No.: US 11,158,713 B2
(45) Date of Patent: Oct. 26, 2021

(54) SEMICONDUCTOR DEVICE

(71) Applicant: FUJI ELECTRIC CO., LTD., Kawasaki (JP)

(72) Inventor: Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/555,298

(22) Filed: Aug. 29, 2019

(65) Prior Publication Data

US 2020/0083338 A1 Mar. 12, 2020

(30) Foreign Application Priority Data

Sep. 11, 2018 (JP) .............................. JP2018-170106

(51) Int. Cl.
| | |
|---|---|
| *H01L 29/423* | (2006.01) |
| *H01L 27/06* | (2006.01) |
| *H01L 29/16* | (2006.01) |
| *H01L 29/49* | (2006.01) |
| *H01L 29/78* | (2006.01) |
| *H01L 29/43* | (2006.01) |

(52) U.S. Cl.
CPC ...... *H01L 29/4236* (2013.01); *H01L 27/0629* (2013.01); *H01L 29/1608* (2013.01); *H01L 29/4238* (2013.01); *H01L 29/435* (2013.01); *H01L 29/4983* (2013.01); *H01L 29/7811* (2013.01); *H01L 29/7813* (2013.01)

(58) Field of Classification Search
CPC ......................... H01L 27/0629; H01L 29/4238
See application file for complete search history.

(56) References Cited

U.S. PATENT DOCUMENTS

| | | | |
|---|---|---|---|
| 2016/0379992 A1 | 12/2016 | Nagao et al. | |
| 2017/0110545 A1* | 4/2017 | Nagao | H01L 23/535 |
| 2017/0338336 A1 | 11/2017 | Nasu | |
| 2020/0388704 A1* | 12/2020 | Tominaga | H01L 29/407 |

FOREIGN PATENT DOCUMENTS

| | | |
|---|---|---|
| JP | 2003197914 A | 7/2003 |
| JP | 2017212432 A | 11/2017 |
| WO | 2015080162 A1 | 6/2015 |

\* cited by examiner

*Primary Examiner* — Farun Lu

(57) ABSTRACT

A gate pad includes a first portion disposed in a gate pad region and a second portion continuous with the first portion and disposed in a gate resistance region. The gate pad has a planar shape in which the second portion protrudes from the first portion. A gate polysilicon layer provided on a front surface of a semiconductor substrate via a gate insulating film is disposed between the semiconductor substrate and an interlayer insulating film, has a surface area that is at least equal to a surface area of the gate pad, and faces the gate pad in a depth direction. The gate polysilicon layer has a planar outline similar to that of the gate pad and includes continuous first and second portions, the first portion facing the first portion of the gate pad overall, and a second portion facing the second portion of the gate pad.

13 Claims, 11 Drawing Sheets

SEMICONDUCTOR DEVICE

CROSS REFERENCE TO RELATED APPLICATIONS

This application is based upon and claims the benefit of priority of the prior Japanese Patent Application No. 2018-170106, filed on Sep. 11, 2018, the entire contents of which are incorporated herein by reference.

BACKGROUND

1. Field

Embodiments of the invention relate to a semiconductor device.

2. Description of Related Art

A metal oxide semiconductor field effect transistor (MOSFET) includes an insulated gate having a 3-layer structure formed by a metal, an oxide film, and a semiconductor material and conventionally, when plural MOSFET chips are used connected in parallel, it is commonly known that switching operation of the MOSFETs may be stabilized by connecting gate resistance in series between a gate pad and a gate electrode (for example, refer to International Publication No. WO 2015/080162, Japanese Laid-Open Patent Publication No. 2003-197914, Japanese Laid-Open Patent Publication No. 2017-212432).

A structure of a gate pad of a conventional semiconductor device will be described. FIG. 8 is a plan view of a layout of a vicinity of the gate pad of the conventional semiconductor device, as viewed from a front surface side of a semiconductor substrate. In FIG. 8, a layout of a MOS gate disposed in a cell region 105 of an active region is not depicted. FIG. 9 is a cross-sectional view of a structure along cutting line AA-AA' depicted in FIG. 8. FIGS. 8 and 9 are FIGS. 2 and 3b of International Publication No. WO 2015/080162, respectively.

As depicted in FIGS. 8 and 9, in the active region, on a front surface of a semiconductor substrate 110, a source pad 101 and a gate pad 102 are disposed on an interlayer insulating film 111. The source pad 101 is disposed in each cell region 105 that is partitioned by a gate runner 104 and covers substantially the entire active region. The gate pad 102 is provided near a border between the active region and an edge termination region that surrounds a periphery of the active region.

Further, the gate pad 102 is electrically connected to a gate electrode 112 via a built-in resistor 103 and the gate runner 104. The built-in resistor 103 is provided on the front surface of the semiconductor substrate 110 via an oxide film 113 and is disposed between the semiconductor substrate 110 and the interlayer insulating film 111. The built-in resistor 103 faces the gate pad 102 and the gate runner 104 in a depth direction Z, across the interlayer insulating film 111.

The built-in resistor 103 is separated from a vicinity of a wire-bonded center of the gate pad 102 and faces a vicinity of each of 4 vertices of the gate pad 102, which as a substantially rectangular shape. The built-in resistor 103 is made of polysilicon (poly-Si). A size of each built-in resistor 103 is at most 200 $\mu m^2$, whereby a mathematical area of the cell region 105 is prevented from being reduced due to the disposal of the built-in resistor 103.

The built-in resistor 103 is connected in series between the gate electrode 112 and the gate pad 102. A sum of a resistance value of the gate electrode 112 and a resistance value of the built-in resistor 103 is the gate resistance. In International Publication No. WO 2015/080162, the value of the built-in resistor 103 may be made greater than variation of the resistance value of the gate electrode 112 and thus, have a greater influence on the gate resistance that is the sum of the resistance value of the gate electrode 112 and the resistance value of the built-in resistor 103.

By making the resistance value of the built-in resistor 103 have a greater influence on the gate resistance, when plural MOSFET chips having variation in the resistance values of the gate electrodes 112 used connected in parallel, the flow of current to MOSFET chips having a relatively low resistance value of the gate electrode 112 among the plural MOSFET chips is controlled. As a result, an occurrence of noise during switching of the MOSFET is suppressed.

Reference character 111a is a contact hole where a contact between the source pad 101 and, an $n^+$-type source region 114 and a $p^+$-type contact region 115 is formed. Reference character 111b is a contact hole where a contact between the gate pad 102 and the built-in resistor 103 is formed. Reference character 111c is a contact hole where a contact between the gate runner 104 and the built-in resistor 103 is formed. Reference numeral 116 is a passivation film.

FIG. 10 is a plan view of another example of a layout of a vicinity of the gate pad of the conventional semiconductor device, as viewed from the front surface side of the semiconductor substrate. FIG. 11 is a cross-sectional view of a structure along cutting line BB-BB' depicted in FIG. 10. FIGS. 10 and 11 are FIGS. 1(a) and 1(b) of Japanese Laid-Open Patent Publication No. 2003-197914, respectively. As depicted in FIGS. 10 and 11, in Japanese Laid-Open Patent Publication No. 2003-197914 as well, the built-in resistor 103 is disposed so at to face the gate pad 102 in the depth direction Z and prevent decreases in the mathematical area of the active region.

Further, a peripheral edge of the built-in resistor 103 extends in a direction parallel to the front surface of the semiconductor substrate 110 to be further outward (closer to an edge of the semiconductor substrate 110) than is a peripheral edge of the gate pad 102. As a result, an interval L101 between the contact hole 111b where the contact between the built-in resistor 103 and the gate pad 102 is formed and the contact hole 111c where the contact between the built-in resistor 103 and the gate runner 104 is formed is changed, thereby adjusting a resistance value between the gate runner 104 and the gate pad 102.

In Japanese Laid-Open Patent Publication No. 2017-212432, in a semiconductor device in which a transistor and a low-voltage diode are implemented on a single semiconductor substrate, a constant voltage diode made of polysilicon is disposed in a layer beneath the source pad, along an outer periphery of the source pad. Reverse current generated when a large voltage such as static electricity or surge voltage is applied flows in a ground portion via the constant voltage diode, whereby electrostatic discharge (ESD) capability is enhanced.

SUMMARY

According to an embodiment, a semiconductor device includes a gate electrode provided on a semiconductor substrate via a gate insulating film; a gate pad provided on a first main surface of the semiconductor substrate via an interlayer insulating film; a gate resistance connected in series between the gate pad and the gate electrode; and a gate polysilicon layer provided between the first main surface of the semiconductor substrate and the interlayer insulating film to face the gate pad overall in a depth direction across the interlayer insulating film, the gate polysilicon layer electrically insulated from the semiconductor substrate by an oxide film. The gate pad is formed by a first portion to which a wire is bonded, and a second portion that is continuous with the first portion and to which the gate resistance is connected. The gate polysilicon layer is formed by a first portion that faces the first portion of the gate pad overall in the depth direction, across the interlayer insulating film, and a second portion that is continuous with the first portion of the gate polysilicon layer and faces the second portion of the gate pad overall in the depth direction, across the interlayer insulating film, the second portion of the gate polysilicon layer being electrically connected between the second portion of the gate pad and the gate electrode, and forming the gate resistance.

In the embodiment, the second portion of the gate polysilicon layer has a surface area that is smaller than a surface area of the first portion of the gate polysilicon layer.

In the embodiment, the first portion of the gate polysilicon layer has a rectangular planar shape. The second portion of the gate polysilicon layer has a rectangular planar shape having the surface area that is smaller than the surface area of the first portion of the gate polysilicon layer, the rectangular planar shape being continuous with the first portion of the gate polysilicon layer so as to protrude from the first portion of the gate polysilicon layer.

In the embodiment, the first portion of the gate polysilicon layer has a ring-shaped planar shape facing a peripheral edge of the first portion of the gate pad in the depth direction, across the interlayer insulating film, and a planar outline that is larger than a planar outline of the first portion of the gate pad. The second portion of the gate polysilicon layer has a planar shape continuous with the first portion of the gate polysilicon layer so as to protrude from the first portion of the gate polysilicon layer, and a planar outline that is larger than a planar outline of the second portion of the gate pad.

In the embodiment, the second portion of the gate pad has a surface area that is smaller than a surface area of the first portion of the gate pad.

In the embodiment, the first portion of the gate pad has a rectangular planar shape. The second portion of the gate pad has a rectangular planar shape having a surface area that is smaller than a surface area of the first portion of the gate pad, the rectangular planar shape being continuous with the first portion of the gate pad so as to protrude from the first portion of the gate pad.

In the embodiment, the first portion of the gate polysilicon layer has a surface area that is larger than a surface area of the first portion of the gate pad.

In the embodiment, the second portion of the gate polysilicon layer has a surface area that is larger than a surface area of the second portion of the gate pad.

In the embodiment, the semiconductor device further includes a metal layer electrically connected to the gate electrode. The second portion of the gate polysilicon layer and the gate electrode are electrically connected through the metal layer.

In the embodiment, a peripheral edge of the gate pad faces the gate polysilicon layer in the depth direction, across the interlayer insulating film.

In the embodiment, the semiconductor device further includes a trench gate structure including: a first semiconductor region of a second conductivity type provided in a surface layer of the first main surface of the semiconductor substrate of a first conductivity type; a second semiconductor region of the first conductivity type selectively provided in the first semiconductor region; a third semiconductor region of the first conductivity type, the third semiconductor region being a portion of the semiconductor substrate excluding the first semiconductor region; a trench penetrating the second semiconductor region and the first semiconductor region, and reaching the third semiconductor region; and the gate electrode provided on the gate insulating film, in the trench; the semiconductor device further including a first electrode electrically connected to the first semiconductor region and the second semiconductor region; and a second electrode electrically connected to a second main surface of the semiconductor substrate. The trench gate structure is disposed in a region of the semiconductor substrate excluding a region that faces the gate pad in the depth direction.

Objects, features, and advantages of the present invention are specifically set forth in or will become apparent from the following detailed description of the invention when read in conjunction with the accompanying drawings.

DESCRIPTION OF EMBODIMENTS

Figure 1:
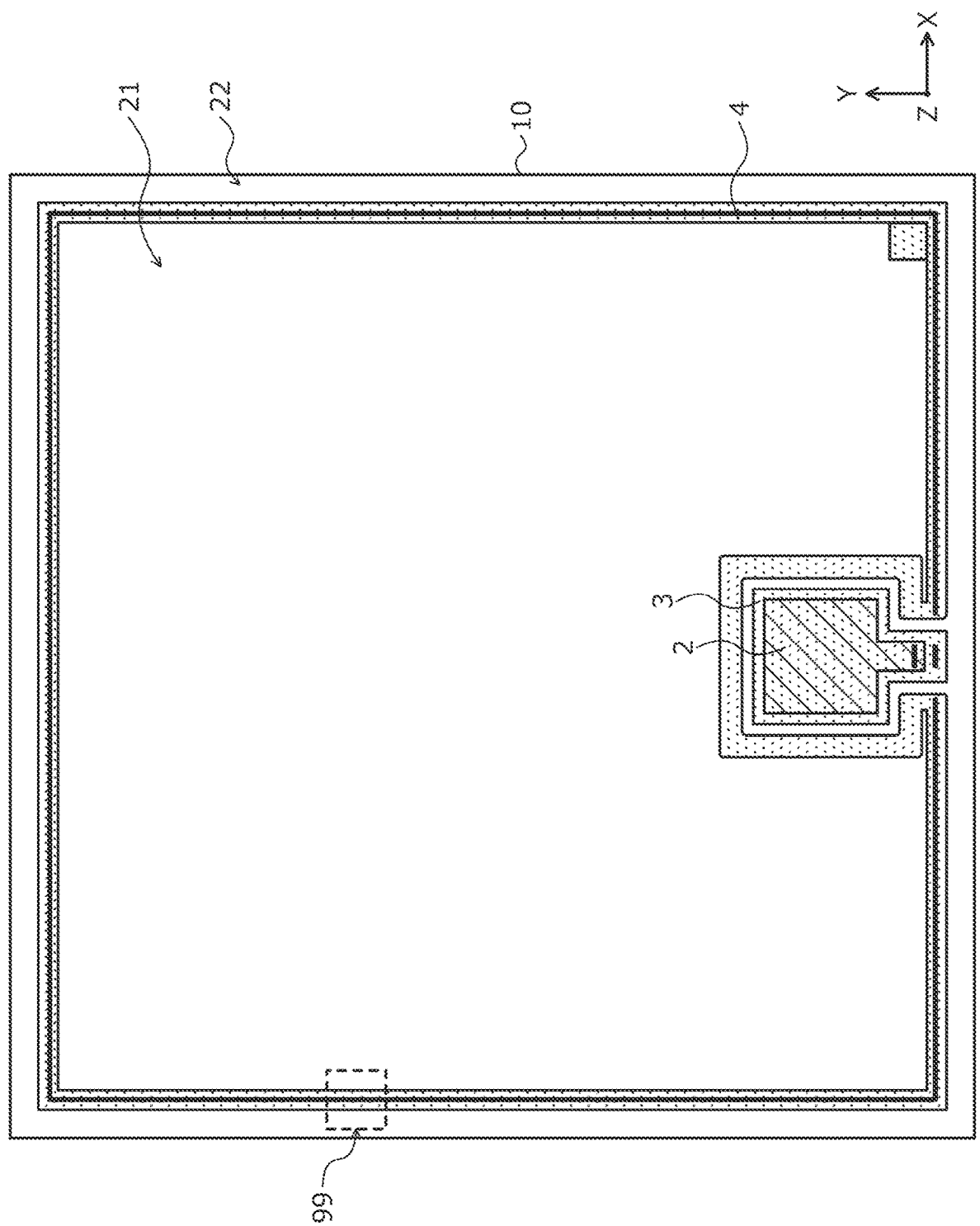
FIG. 1 is a plan view of a layout when a semiconductor device according to a first embodiment is viewed from a front surface side of a semiconductor substrate.
Figure 1A:
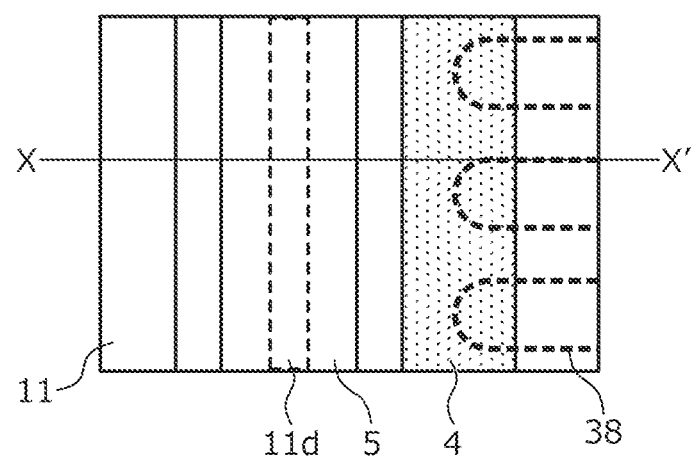
FIG. 1A is an enlarged view of 99 in FIG. 1.
Figure 1B:
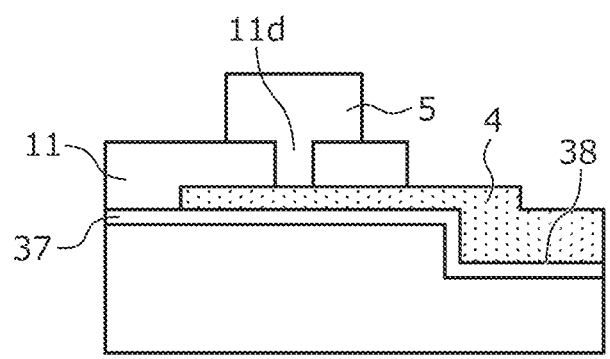
FIG. 1B is a cross-sectional view of a structure along line X-X' in FIG. 1A.

First, problems associated with the conventional techniques will be discussed. In International Publication No. WO 2015/080162 and Japanese Laid-Open Patent Publication No. 2003-197914, since a surface area of the built-in resistor 103 is small, when a large amount of charge is injected in the gate pad 102 by ESD or the like, high voltage is applied to the oxide film 113 beneath the built-in resistor 103, whereby the oxide film 113 is easily destroyed. On the other hand, when the surface area of the built-in resistor 103 is increased and the voltage applied to the oxide film 113 is thereby distributed, unevenness between the gate pad 102 and the front surface of the semiconductor substrate 110 occurs. As a consequence of this unevenness, in some instances, etching for patterning a metal film that forms the gate pad 102 and/or etching of a resist mask for patterning the metal film becomes impossible, or defects caused by etch residue (metal residue, resist residue) that is not completely removed from uneven portions occur, whereby yield may decrease.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
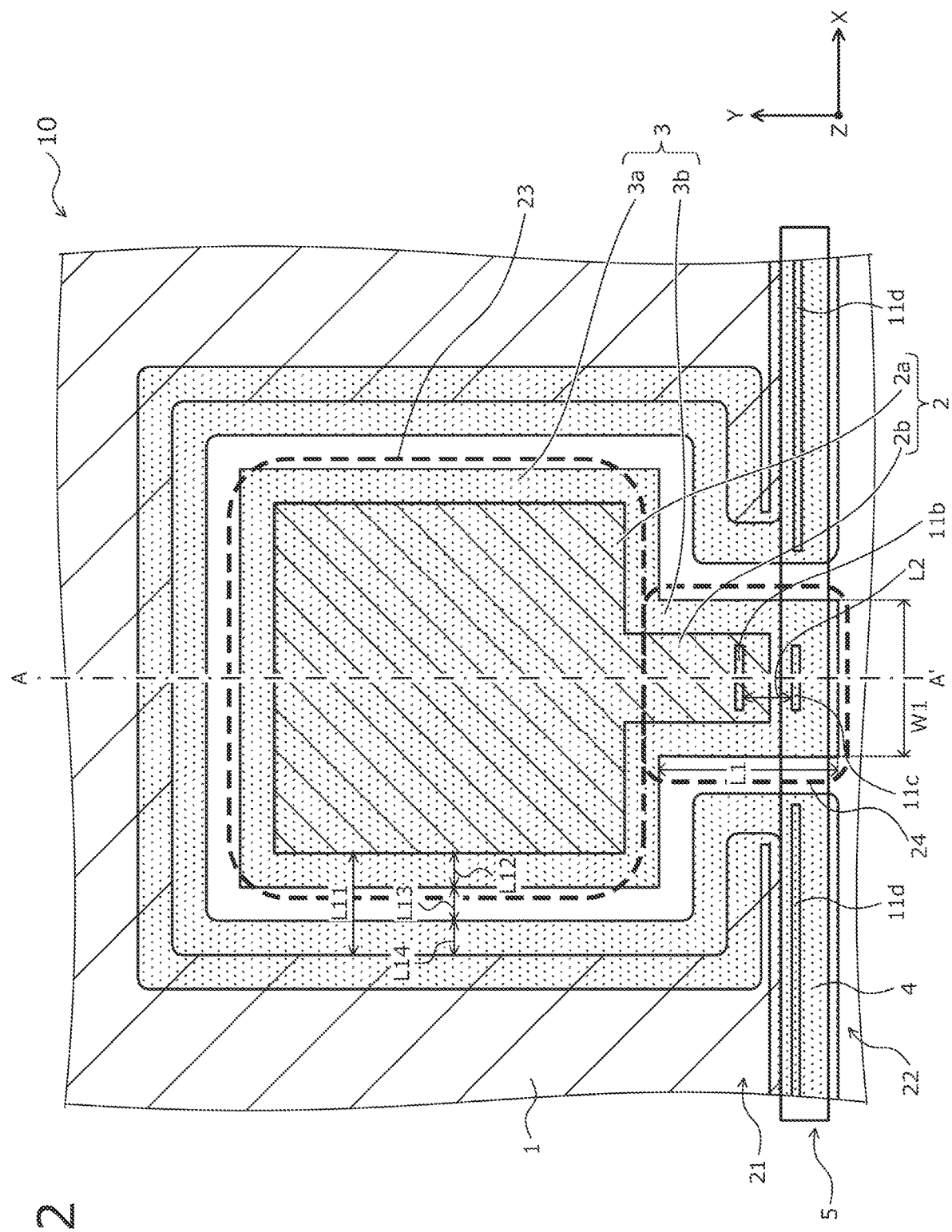
FIG. 2 is an enlarged plan view of a portion of FIG. 1.

A structure of the semiconductor device according to a first embodiment will be described. FIG. 1 is a plan view of a layout when the semiconductor device according to the first embodiment is viewed from a front surface side of the semiconductor substrate (semiconductor chip). FIG. 2 is an enlarged plan view of a portion of FIG. 1. FIG. 2 depicts a vicinity of a gate pad 2 depicted in FIG. 1. First, the layout when the semiconductor device according to the first embodiment is viewed the front surface side of the semiconductor substrate will be described.

Figure 3:
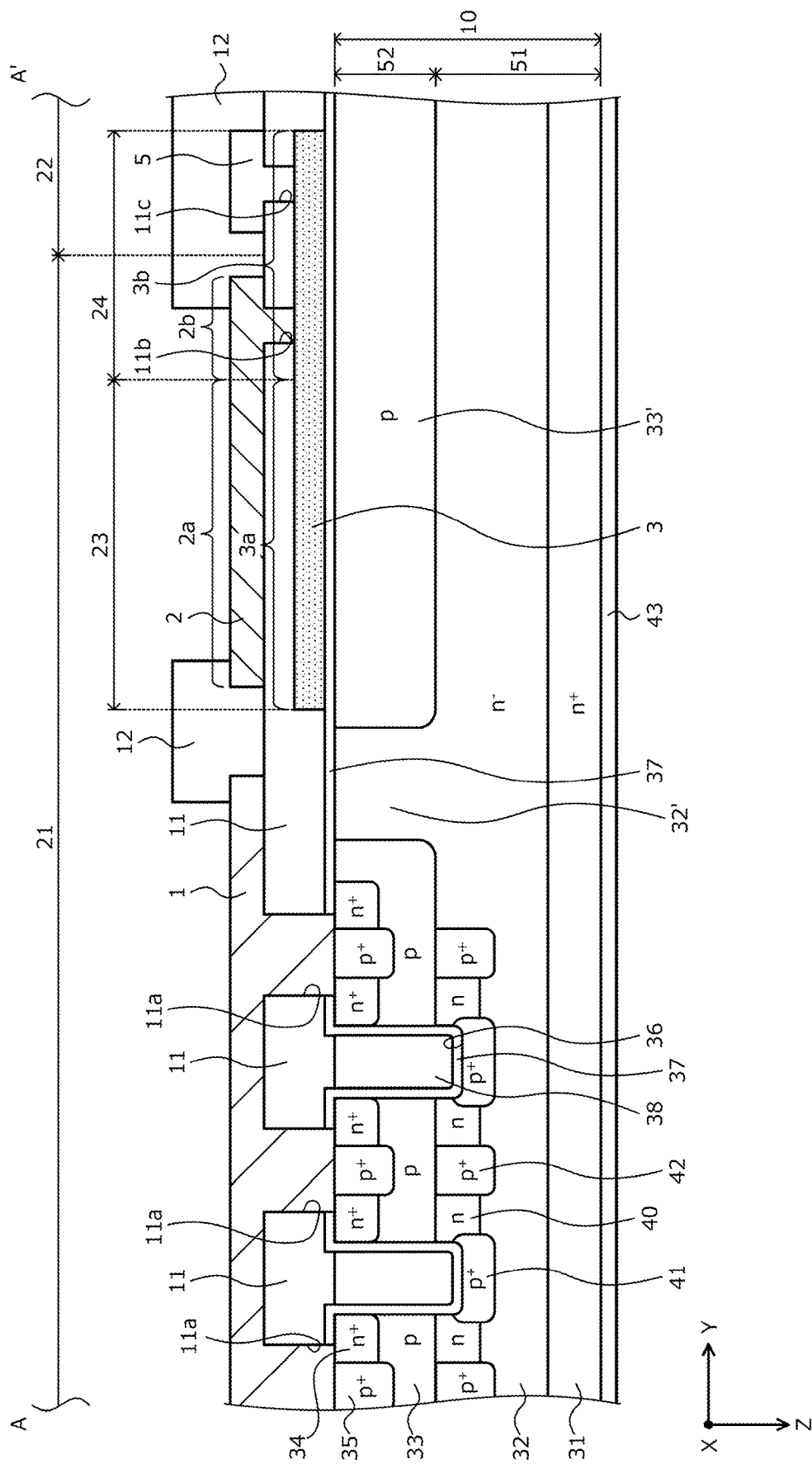
FIG. 3 is a cross-sectional view of a structure along cutting line A-A' depicted in FIG. 2.

The semiconductor device according to the first embodiment and depicted in FIGS. 1, 1A 1B and 2 is a vertical MOSFET that in an active region 21, has a source pad (first electrode) 1 (hatched portion having diagonal lines and indicated by reference numeral 1, not depicted in FIG. 1) and the gate pad 2 (hatched portion having diagonal lines and indicated by reference numeral 2) that are provided on a front surface of a semiconductor substrate 10, via an interlayer insulating film 11 (refer to FIG. 3). In a portion of the active region 21 facing the source pad 1 in the depth direction Z, one or more non-depicted unit cells (functional units of an element) of the MOSFET are disposed.

The active region 21 is a region in which current flows when the MOSFET is in an ON state. A periphery of the active region 21 is surrounded by an edge termination region 22. The edge termination region 22 is a region between the active region 21 and an edge of the semiconductor substrate 10, and has an edge termination structure for mitigating in an n⁻-type drift region (third semiconductor region) 32 (refer to FIG. 3), electric field toward the front surface of the semiconductor substrate 10 and sustaining a breakdown voltage (withstand voltage). The breakdown voltage is a voltage limit at which errant operation and destruction of an element does not occur.

The source pad 1 is disposed separated from the gate pad 2 by a predetermined distance L11. The source pad 1 covers substantially the entire active region 21 excluding a portion of the active region 21 where the gate pad 2 is disposed. In particular, the source pad 1, for example, has a substantially rectangular planar shape that is partially recessed so as to surround a periphery of the gate pad 2 and that has a mathematical area that is substantially equal to a mathematical area of the active region 21. The source pad 1 is electrically connected to an n⁺-type source region (second semiconductor region) 34 (refer to FIG. 3) and a p⁺-type contact region 35 (refer to FIG. 3), via a first contact hole 11a.

Along an entire peripheral edge of the source pad 1, the source pad 1 faces in the depth direction Z across the interlayer insulating film 11, a gate runner 4 containing polysilicon (poly-Si) and described hereinafter. As a result, unevenness that occurs between the source pad 1 and the front surface of the semiconductor substrate 10 becomes smaller, whereby metal residue resulting from patterning of a metal film that contains, for example, aluminum (Al) and forms the source pad 1 decreases, whereby short-circuit defects caused by the metal residue become less likely to occur.

The gate pad 2, for example, is disposed near a boundary between the active region 21 and the edge termination region 22. The gate pad 2 is formed by a first portion 2a disposed in a gate pad region 23 and a second portion 2b disposed in a gate resistance region 24; the first portion 2a and the second portion 2b being connected to each other. In the gate pad 2, a surface area of the second portion 2b is smaller than a surface area of the first portion 2a, and the gate pad 2 has a planar shape in which the second portion 2b is disposed adjacent to the first portion 2a so as to be further outward (closer to the edge of the semiconductor substrate 10) than is the first portion 2a.

In particular, for example, the first and the second portions 2a, 2b of the gate pad 2 may have a planar shape that is substantially rectangular. In this case, each side of the second portion 2b of the gate pad 2 is shorter than sides of the first portion 2a of the gate pad 2. The gate pad 2 has a protruding planar shape in which, of the sides of the first portion 2a, the side that is nearest the boundary between the active region 21 and the edge termination region 22 is connected with the second portion 2b, so that the second portion 2b protrudes from the side of the first portion 2a.

The first and the second portions 2a, 2b of the gate pad 2, for example, similarly to the source pad 1 are formed by a metal film containing aluminum, and are positioned at a same stratum as the source pad 1. The first and the second portions 2a, 2b of the gate pad 2, for example, may be formed concurrently with the source pad 1. Each gate electrode 38 of all the unit cells of the MOSFET is connected to the gate pad 2, via a gate polysilicon layer 3 (dotted hatched portion indicated by reference numeral 3) described hereinafter and the gate runner 4 (dotted hatched portion indicated by reference 4).

The first portion 2a of the gate pad 2 is a portion to which a wire for carrying out electric potential of the gate electrodes 38 (refer to FIG. 3) of the MOSFET is bonded. The second portion 2b of the gate pad 2 is a connection portion for electrically connecting the first portion 2a of the gate pad 2 and a second portion 3b of the gate polysilicon layer 3 described hereinafter. The second portion 2b of the gate pad 2 is electrically connected to the second portion 3b of the gate polysilicon layer 3, via a second contact hole 11b.

The gate polysilicon layer 3 is provided on the front surface of the semiconductor substrate 10, via a gate insulating film 37, and is disposed between the semiconductor substrate 10 and the interlayer insulating film 11. Further, the gate polysilicon layer 3 has a surface area that is at least equal to a surface area of the gate pad 2, and faces the gate pad 2 overall in the depth direction Z. The gate polysilicon layer 3 may have a planar shape identical to that of the gate pad 2. For example, the gate polysilicon layer 3, similarly to the gate pad 2, has a protruding planar shape formed by first and second portions 3a, 3b described hereinafter.

In particular, in the gate polysilicon layer 3, the first portion 3a that is disposed in the gate pad region 23 and the second portion 3b that is disposed in the gate resistance region 24 are continuous. In the gate polysilicon layer 3, the second portion 3b has a surface area that is smaller than a surface area of the first portion 3a. The first and the second portions 3a, 3b of the gate polysilicon layer 3 have planar shapes that are identical to the planar shapes of the first and the second portions 2a, 2b of the gate pad 2, respectively and have surface areas that are at least equal to the surface areas of the first and the second portions 2a, 2b of the gate pad 2, respectively.

The first portion 3a of the gate polysilicon layer 3 faces the first portion 2a of the gate pad 2 overall in the depth direction Z, across the interlayer insulating film 11. The second portion 3b of the gate polysilicon layer 3 faces the second portion 2b of the gate pad 2 overall in the depth direction Z, across the interlayer insulating film 11. The surface areas of the first and the second portions 3a, 3b of the gate polysilicon layer 3, with consideration of process variation, may be larger than the surface areas of the first and the second portions 2a, 2b of the gate pad 2, respectively.

In this manner, by providing the first and the second portions 3a, 3b of the gate polysilicon layer 3, along an entire peripheral edge of the gate pad 2, the gate pad 2 faces the gate polysilicon layer 3 in the depth direction Z, across the interlayer insulating film 11. As a result, unevenness that occurs between the gate pad 2 and the front surface of the semiconductor substrate 10 is smaller, whereby metal residue resulting from patterning of the metal film that forms the gate pad 2 decreases and short-circuit defects caused by the metal residue become less likely to occur.

A distance L12 from a peripheral edge of the gate polysilicon layer 3 to the peripheral edge of the gate pad 2 may be, for example, at least about 3.5 µm. A reason for this is that patterning of the metal film that forms the gate pad 2 is performed by wet etching that, for example, is difficult to use for fine patterns. Thus, with consideration of variation of wet etching, the distance L12 from the peripheral edge of the gate polysilicon layer 3 to the peripheral edge of the gate pad 2 may be set in the range described.

The second portion 3b of the gate polysilicon layer 3 extends outward beyond the second portion 2b of the gate pad 2 so as to terminate in the edge termination region 22. A portion of the second portion 3b of the gate polysilicon layer 3 extending outward beyond the second portion 2b of the gate pad 2, is electrically connected to a contact electrode (metal layer) 5 described hereinafter, via a third contact hole 11c. The second portion 3b of the gate polysilicon layer 3 has a width W1 and a length L1 that are set so as to enable realization of a maximum resistance value of a gate resistance normally used.

The second portion 3b of the gate polysilicon layer 3 is connected in series between the gate pad 2 and the gate electrode 38, and functions as gate resistance. For example, when plural MOSFET chips (semiconductor chips) having variation in the resistance values of the gate electrodes 38 are used connected in parallel, the gate resistance controls the flow of current to the MOSFET chips having a relatively low resistance value of the gate electrode 38 among the plural MOSFET chips and thereby, suppresses an occurrence of noise during switching of the MOSFET.

A resistance value of gate resistance due to the second portion 3b of the gate polysilicon layer 3 is determined by a distance L2 between the second contact hole 11b where a contact between the second portion 3b of the gate polysilicon layer 3 and the second portion 2b of the gate pad 2 is formed, and the third contact hole 11c where a contact between the second portion 3b of the gate polysilicon layer 3 and the contact electrode 5 is formed. The resistance value of the gate resistance may be adjusted by varying the distance L2 between the second and the third contact holes 11b, 11c within a range substantially equal to the length L1 of the second portion 3b of the gate polysilicon layer 3.

The gate runner 4, in the edge termination region 22, is provided in a ring-shape along the boundary between the active region 21 and the edge termination region 22, and surrounds a periphery of the active region 21. Further, the gate runner 4 is disposed separated from the gate polysilicon layer 3 by a predetermined distance L13 and extends inwardly (toward a center portion of the semiconductor substrate 10) along the gate polysilicon layer 3 so as to surround a periphery of the gate polysilicon layer 3. In the gate runner 4, outer surrounding portions that surround a periphery of the active region 21, inner surrounding portions that surround a periphery of the gate polysilicon layer 3, and ends of the gate electrodes 38 are electrically connected.

All the gate electrodes 38 are electrically connected by the gate runner 4. For example, in the active region 21, when viewed from the front surface side of the semiconductor substrate 10, there is a region where in a direction (hereinafter, a first direction X) in which trenches 36 (refer to FIG. 3) extend in a striped shape, some of the outer surrounding portions of the gate runner 4 face each other across MOS gates, and there are regions where some of the outer surrounding portions of the gate runner 4 and some of the inner surrounding portions face each other across the MOS gates.

In the region where some of the outer surrounding portions of the gate runner 4 face each other across the MOS gates in the first direction X, the ends of the gate electrodes 38 and the outer surrounding portions of the gate runner 4 facing the ends are electrically connected. In the regions where some of the outer surrounding portions of the gate runner 4 and some of the inner surrounding portions face each other across the MOS gates in the first direction X, first ends of the gate electrodes 38 and the outer surrounding portions of the gate runner 4 that face the first ends are electrically connected while second ends of the gate electrodes 38 and the inner surrounding portions of the gate runner 4 facing the second ends are electrically connected.

The gate runner 4 is a polysilicon layer and is positioned at a same stratum as the gate polysilicon layer 3. The gate runner 4, for example, may be formed concurrently with the gate polysilicon layer 3. The distance L13 that is the shortest distance between the gate runner 4 and the gate polysilicon layer 3 may be reduced to the limit of etching precision and, for example, may be about 3 µm. The distance L13 that is the shortest distance between the gate runner 4 and the gate polysilicon layer 3 is the distance between the gate runner 4 and the gate polysilicon layer 3, in a portion of the gate runner 4 along the gate polysilicon layer 3.

Further, the gate runner 4 faces the peripheral edge of the source pad 1 in the depth direction Z and has an inner peripheral edge that faces the source pad 1 in the depth direction Z, across the interlayer insulating film 11. A distance L14 from an outer peripheral edge of the gate runner 4 to the peripheral edge of the source pad 1 may be, for example, at least about 3.5 µm. A reason for this is identical to the reason for setting the distance L12 from the peripheral edge of the gate polysilicon layer 3 to the peripheral edge of the gate pad 2 as described above.

The gate runner 4 is disposed in substantially a ring-shape as viewed from the front surface side of the semiconductor substrate 10 and the inner peripheral edge of the gate runner 4 is the edge on a center-side (inner side) of the gate runner 4. The outer peripheral edge of the gate runner 4 is the edge on the side of the gate runner 4, opposite the center-side of the gate runner 4. A portion of the outer peripheral edge of the gate runner 4 along the boundary between the active region 21 and the edge termination region 22 faces the edge termination region 22 while a portion of the outer peripheral edge of the gate runner 4 along the gate polysilicon layer 3 faces the gate polysilicon layer 3.

The portion of the gate runner 4 along the boundary between the active region 21 and the edge termination region 22 is electrically connected to the contact electrode 5 via a fourth contact hole 11d. The fourth contact hole 11d is disposed in a substantially ring-shape that surrounds a periphery of the active region 21 and has a portion that is opened at the gate resistance region 24. Further, the fourth contact hole 11d is disposed closer to the edge of the semiconductor substrate 10 than is the source pad 1 and does not face the source pad 1 in the depth direction Z.

The contact electrode 5 is disposed closer to the edge of the semiconductor substrate 10 than are the source pad 1 and the gate pad 2, and is separated from the source pad 1 and the gate pad 2. Further, the contact electrode 5 is provided in a substantially ring-shape along the boundary between the active region 21 and the edge termination region 22 and in the depth direction Z, faces the second portion 3b of the gate polysilicon layer 3 and a portion of the gate runner 4 along the boundary between the active region 21 and the edge termination region 22.

The contact electrode 5, as described above, is electrically connected to the second portion 3b of the gate polysilicon layer 3 via the third contact hole 11c and is thereby electrically connected to the gate pad 2 via the gate resistance due to the second portion 3b of the gate polysilicon layer 3. Additionally, the contact electrode 5, as described above, is electrically connected to the gate runner 4 via the fourth contact hole 11d and is thereby electrically connected to the gate electrode 38 via the gate runner 4.

The contact electrode 5, for example, similarly to the source pad 1, is formed by a metal film containing aluminum and is positioned at a same stratum as the source pad 1. Therefore, in connecting in series, the gate resistance due to the second portion 3b of the gate polysilicon layer 3 between the gate pad 2 and the gate electrode 38, collection of electric potential of the gate electrode 38 at the gate pad 2 by the contact electrode 5 having a resistance lower than that of the gate polysilicon layer 3 becomes possible.

A cross-section of a structure of the semiconductor device according to the first embodiment will be described. FIG. 3 is a cross-sectional view of a structure along cutting line A-A' depicted in FIG. 2. The semiconductor substrate 10, for example, is a silicon carbide epitaxial substrate in which an n$^-$-type silicon carbide layer 51 and a p-type silicon carbide layer 52 forming the n$^-$-type drift region 32 and a p-type base region (first semiconductor region) 33, respectively, are sequentially formed by epitaxial growth on a front surface of an n$^+$-type starting substrate 31 that contains silicon carbide (SiC). The n$^+$-type starting substrate 31 is an n$^+$-type drain region.

The semiconductor substrate 10 has on opposite sides thereof, main surfaces including a front surface on a side having the p-type silicon carbide layer 52 and a rear surface on a side having the n$^+$-type starting substrate 31 (rear surface of the n$^+$-type starting substrate 31). In the active region 21, the MOS gates are provided in a region excluding the gate pad region 23 and the gate resistance region 24. The MOS gates are formed by the p-type base region 33, the n$^+$-type source regions 34, the p$^+$-type contact regions 35, the trenches 36, the gate insulating films 37, and the gate electrodes 38.

In particular, in the active region 21, the n$^+$-type source regions 34 and the p$^+$-type contact regions 35 are selectively provided in the p-type silicon carbide layer 52, from the front surface of the semiconductor substrate 10 to a depth not reaching the n$^-$-type silicon carbide layer 51. The trenches 36, in the active region 21, penetrate the n$^+$-type source regions 34 and the p-type silicon carbide layer 52 in the depth direction Z from the front surface of the semiconductor substrate 10 and terminate in the n$^-$-type silicon carbide layer 51.

The trenches 36 are disposed in a striped shape extending along a direction (hereinafter, first direction) X parallel to the front surface of the semiconductor substrate 10. While not depicted, ends of the trenches 36 terminate at an outer peripheral portion of the gate polysilicon layer 3 and face the outer peripheral portion of the gate polysilicon layer 3 in the depth direction Z, across the interlayer insulating film 11. The trenches 36 may be disposed in a ring-shape in which the ends of the trenches 36 that are adjacent are connected, as viewed from the front surface side of the semiconductor substrate 10.

In each of the trenches 36, the gate insulating film 37 is provided along an inner wall (side walls and bottom) of the trench 36. The gate insulating film 37 extends on the front surface of the semiconductor substrate 10 and covers the front surface of the semiconductor substrate 10 in the gate pad region 23 and the gate resistance region 24. The gate electrode 38 is provided on the gate insulating film 37 in each of the trenches 36 and faces the n$^+$-type source region 34, across the gate insulating film 37 at the side walls of the trench 36.

A portion of the p-type silicon carbide layer 52 excluding the n$^+$-type source region 34, the p$^+$-type contact region 35, the trench 36, an n$^-$-type region 32', and a p-type region 33' forms the p-type base region 33. The p-type region 33' is a portion of the p-type silicon carbide layer 52 in the gate pad region 23 and the gate resistance region 24, and is separated from the p-type base region 33 by the n$^-$-type region 32. In other words, beneath (drain side) the gate pad 2, only the p-type region 33' is provided and none of the MOS gates are provided.

The p-type region 33' is provided spanning the gate pad region 23 and the gate resistance region 24. The n$^-$-type region 32' surrounds a periphery of a continuous region from the gate pad region 23 to the gate resistance region 24. The n$^-$-type region 32' penetrates the p-type silicon carbide layer 52 in the depth direction Z and reaches the n$^-$-type silicon carbide layer 51. The n$^-$-type region 32' is in contact with a portion of the n$^-$-type silicon carbide layer 51 constituting the n$^-$-type drift region 32 and functions as an n$^-$-type drift region.

Further, in the active region 21, n-type current spreading regions 40 and first and second p$^+$-type regions 41, 42 may be provided in the n$^-$-type silicon carbide layer 51. A portion of the n$^-$-type silicon carbide layer 51 excluding the n-type current spreading regions 40 and the first and the second p$^+$-type regions 41, 42 forms the n$^-$-type drift region 32. The n-type current spreading regions 40 form a so-called a current spreading layer (CSL) that reduces carrier spreading resistance.

Each of the n-type current spreading regions 40 is provided in a mesa region between adjacent trenches 36 and reaches side walls of the adjacent trenches 36 that sandwich the mesa region. The n-type current spreading regions 40 are in contact with the p-type base region 33 and from interfaces between the p-type base region 33 and the n-type current spreading regions 40, reach positions deeper on the drain side (closer to the n$^+$-type starting substrate 31) than are positions of the bottoms of the trenches 36. The n-type current spreading regions 40 may be in contact with the first and the second p$^+$-type regions 41, 42.

The first p$^+$-type regions 41 are disposed separated from the p-type base region 33, at positions closer to the n$^+$-type starting substrate 31 than is a position of the p-type base region 33 and oppose the bottoms of the trenches 36 in the depth direction Z. The second p$^+$-type regions 42, in the mesa regions, are in contact with the p-type base region 33 and are separated from the first p$^+$-type regions 41 and the trenches 36. The first and the second p$^+$-type regions 41, 42 have a function of suppressing electric field that is applied to the gate insulating film 37 when the MOSFET is OFF.

The interlayer insulating film 11 is provided at the front surface of the semiconductor substrate 10 overall so as to cover the gate electrode 38 and the gate insulating film 37 that extends onto the front surface of the semiconductor substrate 10. From the gate pad region 23 and into the gate resistance region 24, the gate polysilicon layer 3 is provided between the interlayer insulating film 11 and the gate insulating film 37. The gate polysilicon layer 3 faces the p-type region 33' in the depth direction Z, across the gate insulating film 37.

The first to the fourth contact holes 11a to 11d that penetrate the interlayer insulating film 11 and the gate insulating film 37 in the depth direction Z are provided. In the first contact holes 11a, the n$^+$-type source regions 34 and the p$^+$-type contact regions 35 are exposed. The second contact hole 11b is positioned closer to the gate pad region 23 than is the third contact hole 11c. In the second and the third contact holes 11b, 11c, the second portion 3b of the gate polysilicon layer 3 is exposed. In the fourth contact hole 11d (refer to FIG. 2), the gate runner 4 is exposed.

In a portion of the active region 21 excluding the gate pad region 23 and the gate resistance region 24, the source pad 1 is provided on the interlayer insulating film 11 so as to be embedded in the first contact holes 11a. The source pad 1 is in contact with the n$^+$-type source regions 34 and the p$^+$-type contact regions 35 in the first contact holes 11a, thereby forming contacts with the n$^+$-type source regions 34 and the p$^+$-type contact regions 35.

The gate pad 2 is provided on the interlayer insulating film 11, spanning the gate pad region 23 and the gate resistance region 24, so as to be embedded in the second contact hole 11b. The first and the second portions 2a, 2b of the gate pad 2 face the first and the second portions 3a, 3b of the gate polysilicon layer 3 in the depth direction Z, across the interlayer insulating film 11. The second portion 2b of the gate pad 2 is in contact with the second portion 3b of the gate polysilicon layer 3 in the second contact hole 11b, thereby forming a contact with the second portion 3b of the gate polysilicon layer 3.

The contact electrode 5 is provided on the interlayer insulating film 11, along the boundary between the active region 21 and the edge termination region 22, so as to be embedded in the third and the fourth contact holes 11c, 11d. The contact electrode 5 faces the second portion 3b of the gate polysilicon layer 3 and the gate runner 4 (refer to FIG. 2) the depth direction Z, across the interlayer insulating film 11. The contact electrode 5 is in contact with the second portion 3b of the gate polysilicon layer 3 in the third contact hole 11c, thereby forming a contact with the second portion 3b of the gate polysilicon layer 3. The contact electrode 5 is in contact with the gate runner 4 in the fourth contact hole 11d, thereby forming a contact with the gate runner 4.

A passivation film 12 is an uppermost layer of the front surface side of the semiconductor substrate 10 and is a protective film that protects the front surface of the semiconductor substrate 10. In the passivation film 12, openings are formed that respectively expose regions of the source pad 1 and the gate pad 2 where a wire is bonded. At the rear surface of the semiconductor substrate 10 overall, a drain electrode (second electrode) 43 is provided. The drain electrode 43 is in contact with the n$^+$-type drain region that is formed by the n$^+$-type starting substrate 31, thereby forming a contact with the n$^+$-type drain region.

As described above, according to the first embodiment, the gate polysilicon layer that is disposed on the front surface of the semiconductor substrate via the gate insulating film includes the first and the second portions that have differing surface areas. As a result, gate resistance connected in series between the gate pad and the gate runner (gate electrode) may be formed by the second portion that is of the gate polysilicon layer and has the relatively smaller surface area. A resistance value of the gate resistance may be easily adjusted by the distances between the contact between the gate pad and the second portion of the gate polysilicon layer and the contact between the gate runner and the second portion of the gate polysilicon layer.

Further, according to the first embodiment, the gate polysilicon layer includes the first and the second portions that have differing surface areas and thus, the surface area of the gate polysilicon layer increases overall by the first portion of the gate polysilicon layer, which has a surface area that is larger is than the surface area of the second portion that forms the gate resistance. As a result, even when a large amount of charge due to ESD or the like is injected into the gate pad, voltage applied to the oxide film (gate insulating film) beneath the gate polysilicon layer is distributed, thereby enabling insulation breakdown of the oxide film to be suppressed. Therefore, ESD capability may be enhanced without adversely affecting the resistance value of the gate resistance formed by the second portion of the gate polysilicon layer.

Further, according to the first embodiment, the entire peripheral edge of the gate pad faces the gate polysilicon layer in the depth direction, across interlayer insulating film, thereby enabling the unevenness between the gate pad and the front surface of the semiconductor substrate to be reduced, whereby problems occurring due to the unevenness are less likely to occur. As a result, yield may be enhanced. Further, the gate pad and the gate polysilicon layer may be disposed in a region having substantially the same surface area as the surface area of the gate polysilicon layer, thereby enabling reductions in the size of the semiconductor chip.

Further, according to the first embodiment, the gate resistance formed by the second portion of the gate polysilicon layer is built into the same semiconductor substrate as the MOSFET, whereby a lower-cost MOSFET may be provided as compared to a case where the gate resistance is provided as a separate component.

Figure 4:
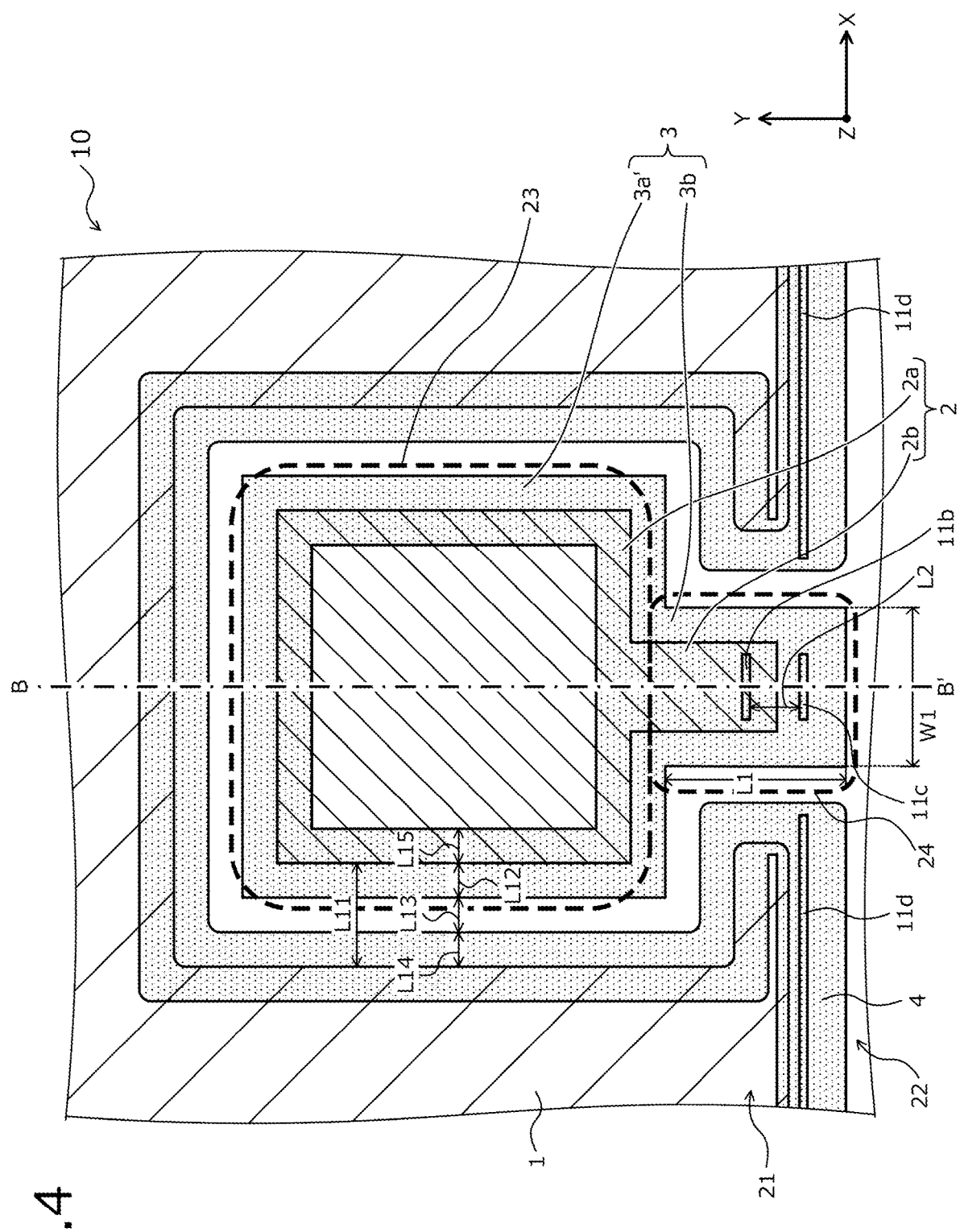
FIG. 4 is a plan view of a layout of a portion of the semiconductor device according to a second embodiment, as viewed from the front surface side of the semiconductor substrate.
Figure 5:
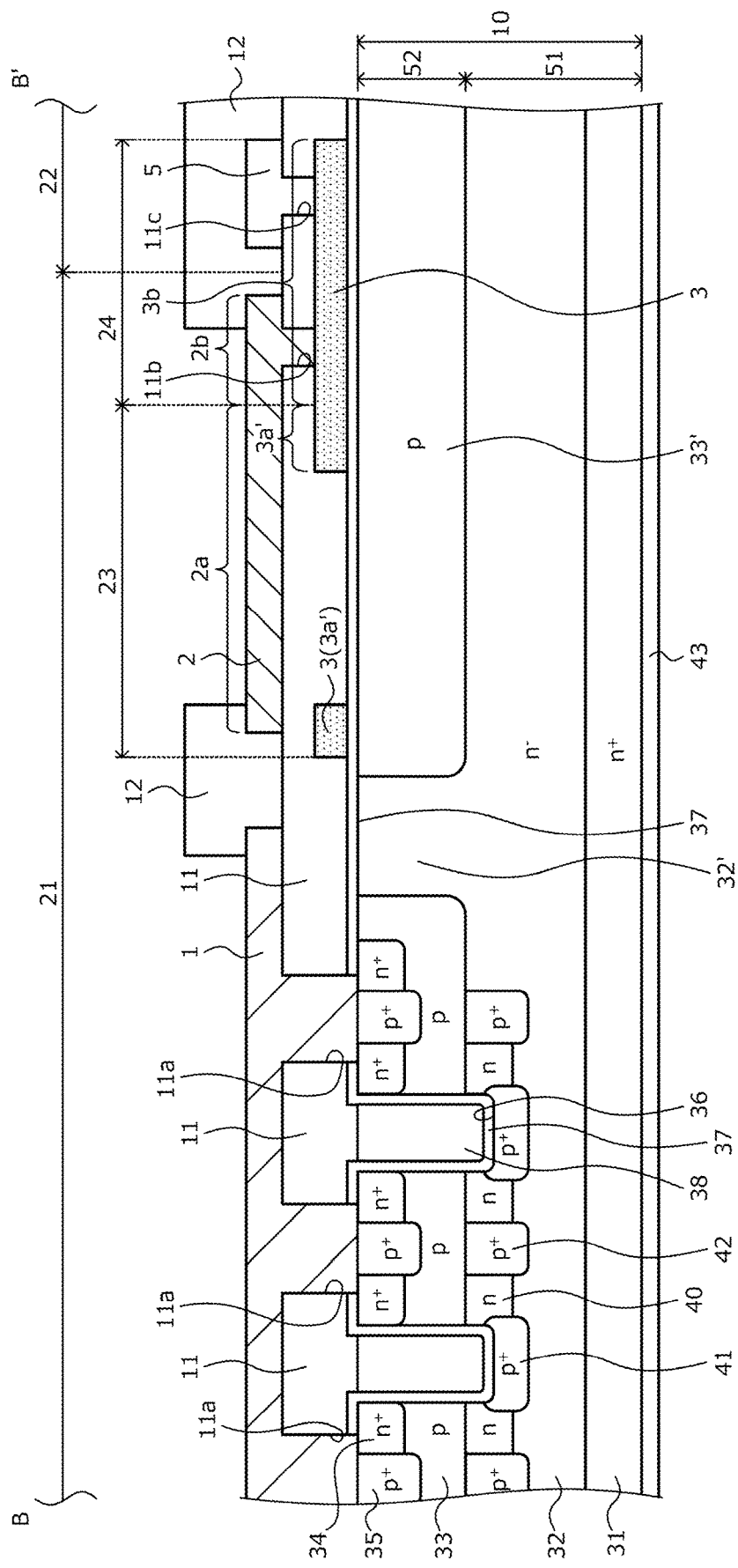
FIG. 5 is a cross-sectional view of a structure along cutting line B-B' depicted in FIG. 4.

A structure of the semiconductor device according to a second embodiment will be described. FIG. 4 is a plan view of a layout of a portion of the semiconductor device according to the second embodiment, as viewed from the front surface side of the semiconductor substrate. FIG. 5 is a cross-sectional view of a structure along cutting line B-B' depicted in FIG. 4. An overall layout of the semiconductor device according to the second embodiment, as viewed from the front surface side of the semiconductor substrate 10 is similar to an overall layout in which in FIG. 1, the first portion 3a of the gate polysilicon layer 3 is replaced with a first portion 3a' of the gate polysilicon layer 3 depicted in FIG. 4.

The semiconductor device according to the second embodiment differs from the semiconductor device according to the first embodiment in that the first portion 3a' of the gate polysilicon layer 3 has a substantially ring-shaped planar shape. A distance L15 from an inner peripheral edge of the first portion 3a' of the gate polysilicon layer 3 to the peripheral edge of the gate pad 2 may be, for example, about 5 μm with consideration of wet etching variation. The first portion 2a of the gate pad 2, similarly to the first embodiment, has a substantially rectangular planar shape.

A planar outline (contour of the peripheral edge) of the first portion 2a of the gate pad 2 is similar to a planar outline of the first portion 3a' of the gate polysilicon layer 3. At a peripheral edge of the first portion 2a of the gate pad 2, the first portion 2a of the gate pad 2 faces the first portion 3a' of the gate polysilicon layer 3 in the depth direction Z, across the interlayer insulating film 11. The peripheral edge of the gate pad 2 is positioned between the inner peripheral edge and an outer peripheral edge of the first portion 3a' of the gate polysilicon layer 3.

As described above, according to the second embodiment, effects similar to those of the first embodiment may be obtained. Further, according to the second embodiment, the first portion of the gate polysilicon layer has a substantially ring-shaped planar shape, thereby enabling adjustment of electrostatic capacitance that occurs at a portion of the gate insulating film between the first portion of the gate polysilicon layer and the semiconductor substrate.

Figure 6:
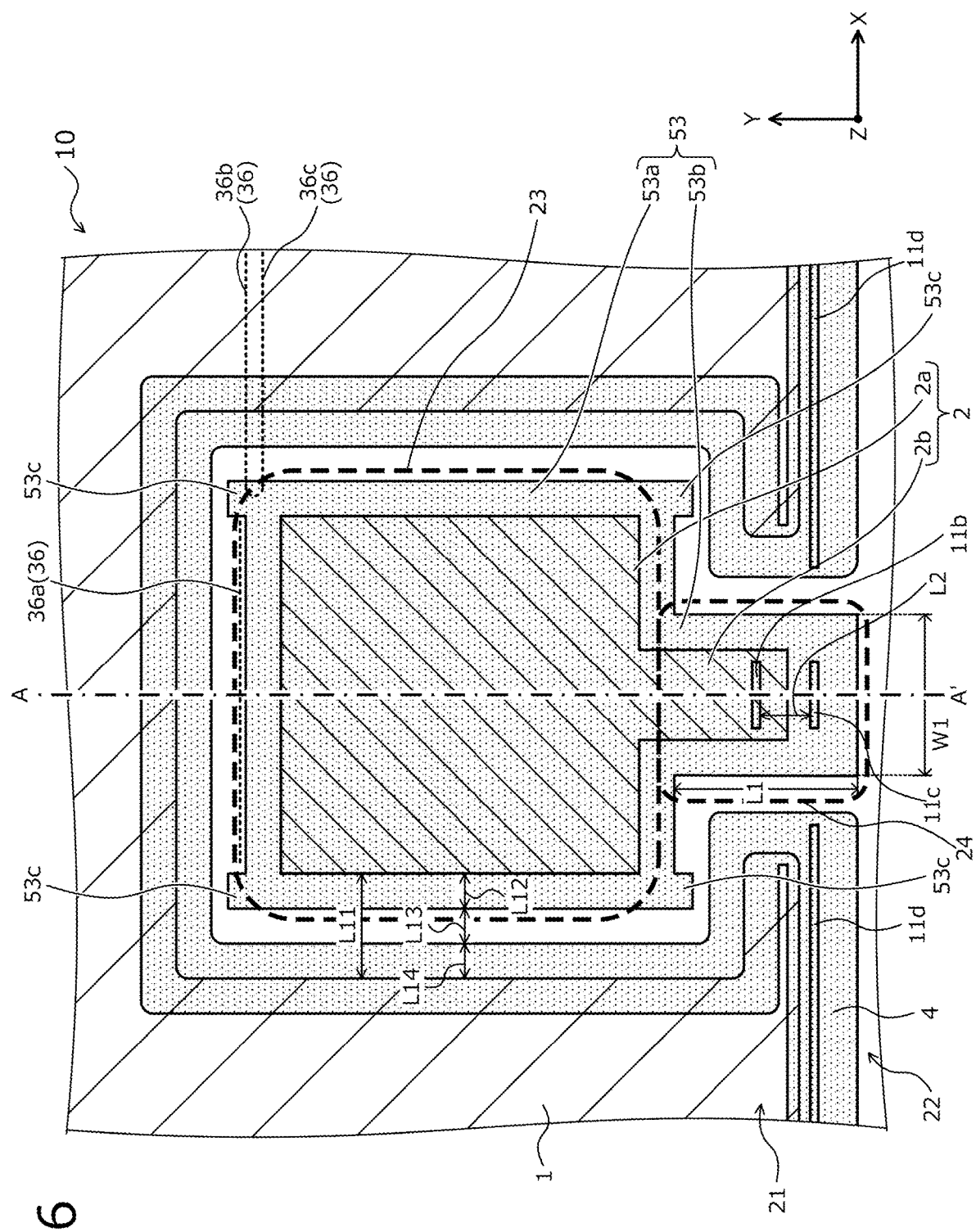
FIG. 6 is a plan view of a layout of a portion of the semiconductor device according to a third embodiment, as viewed from the front surface side of the semiconductor substrate.
Figure 7:
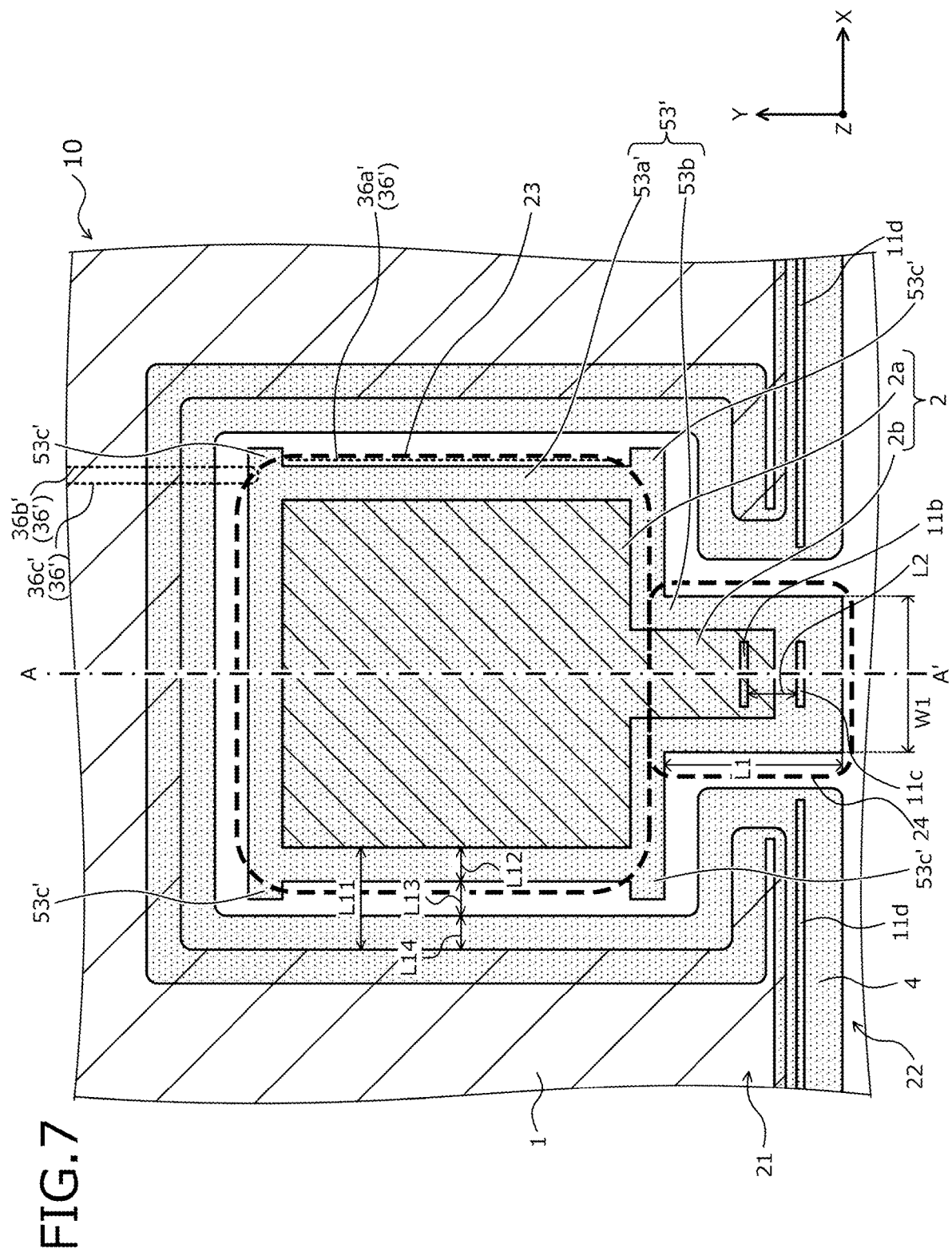
FIG. 7 is a plan view of another example of a layout of the portion of the semiconductor device according to the third embodiment, as viewed from the front surface side of the semiconductor substrate.
Figure 8:
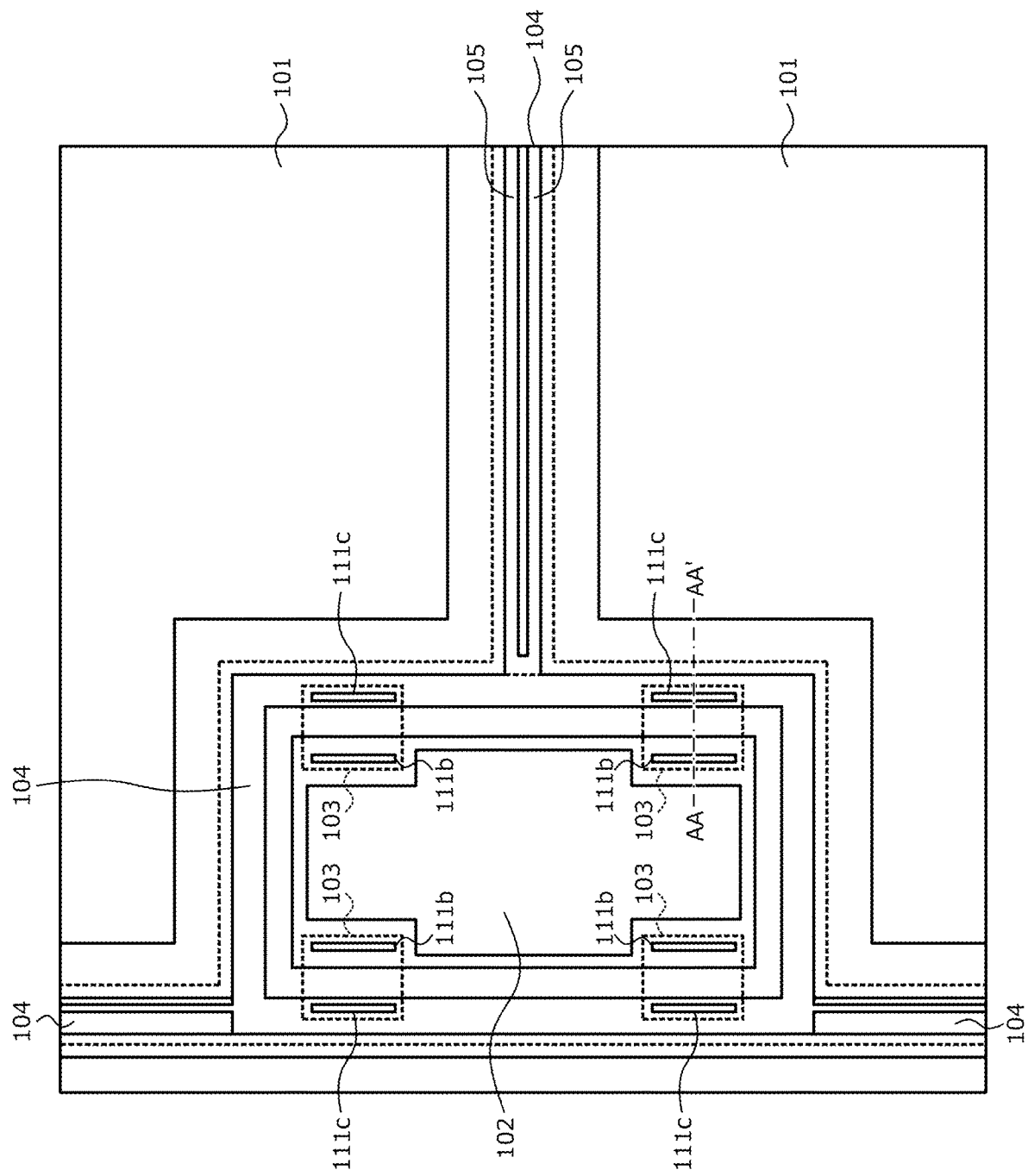
FIG. 8 is a plan view of a layout of a vicinity of a gate pad of a conventional semiconductor device, as viewed from a front surface side of a semiconductor substrate.
Figure 9:
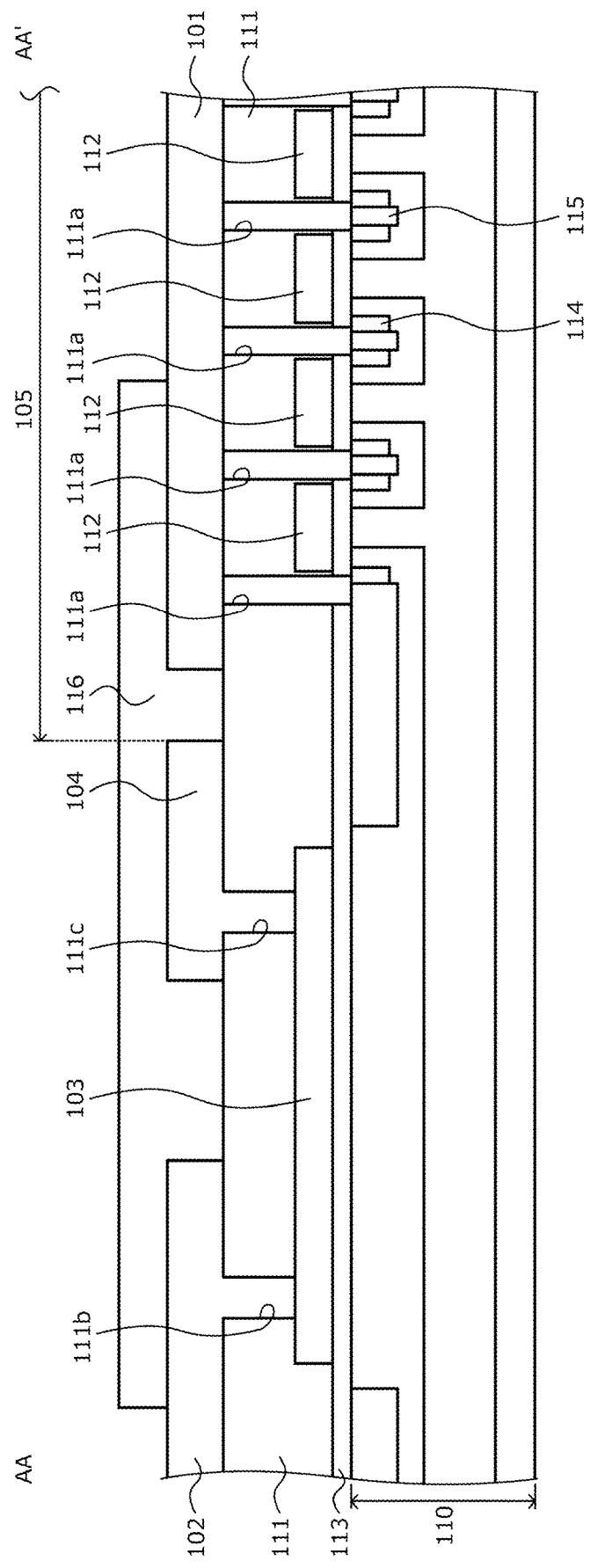
FIG. 9 is a cross-sectional view of a structure along cutting line AA-AA' depicted in FIG. 8.
Figure 10:
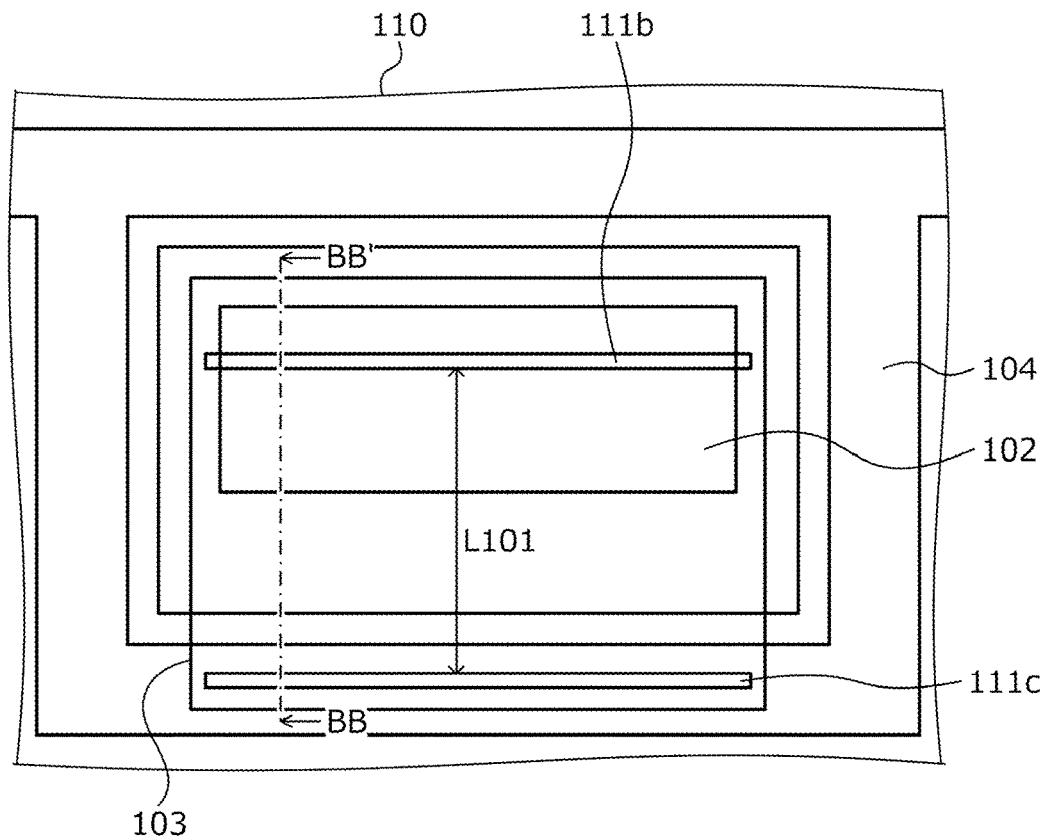
FIG. 10 is a plan view of another example of a layout of a vicinity of the gate pad of the conventional semiconductor device, as viewed from the front surface side of the semiconductor substrate.
Figure 11:
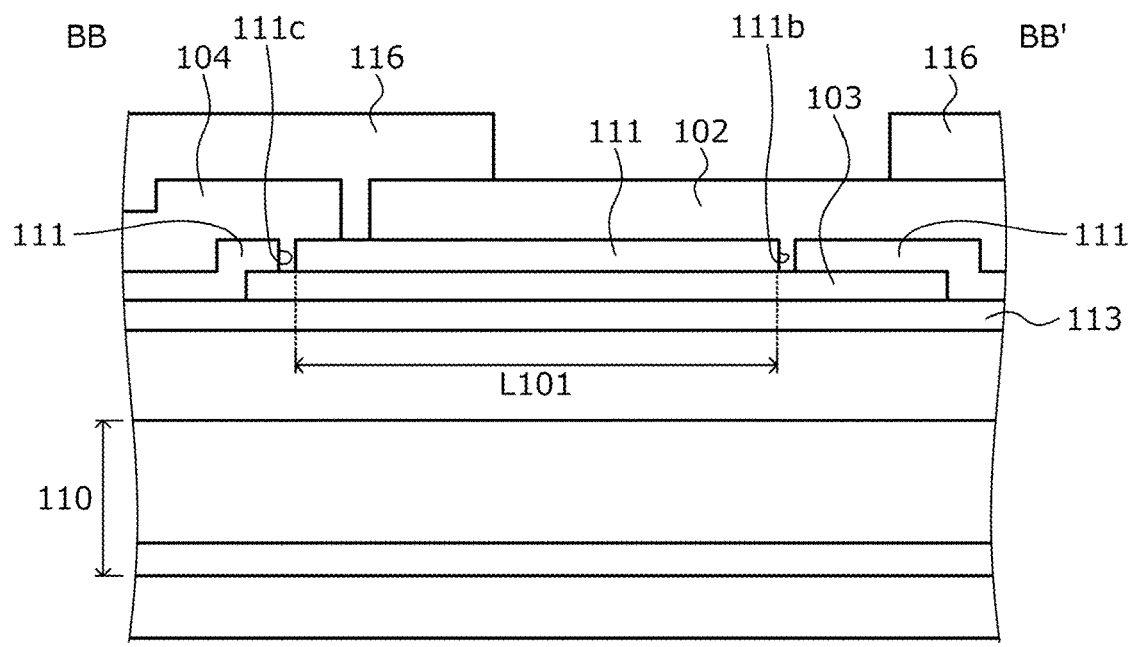
FIG. 11 is a cross-sectional view of a structure along cutting line BB-BB' depicted in FIG. 10.

A structure of the semiconductor device according to a third embodiment will be described. FIG. 6 is a plan view of a layout of a portion of the semiconductor device according to the third embodiment, as viewed from the front surface side of the semiconductor substrate. FIG. 7 is a plan view of another example of a layout of the portion of the semiconductor device according to the third embodiment, as viewed from the front surface side of the semiconductor substrate. An overall layout of the semiconductor device according to the third embodiment, as viewed from the front surface side of the semiconductor substrate 10 is similar to an overall layout in which in FIG. 1, the first portion 3a of the gate polysilicon layer 3 is replaced with first portions 53a, 53a' of gate polysilicon layers 53, 53' depicted in FIGS. 6 and 7.

The semiconductor device according to the third embodiment differs from the semiconductor device according to the first embodiment in that the first portion 53a of the gate polysilicon layer 53 has a substantially rectangular planar shape that at each end of a pair of opposing sides, has a third portion 53c that protrudes from the ends. The third portion 53c of the gate polysilicon layer 53 is provided at both ends of the opposing sides of the first portion 53a of the gate polysilicon layer 53, the opposing sides that are parallel to the first direction X along which the trenches 36 extend in the striped shape.

At sides of the first portion 53a of the gate polysilicon layer 53 parallel to a direction (hereinafter, a second direction) Y that is parallel to the front surface of the semiconductor substrate 10 and orthogonal to the first direction X, the third portion 53c of the gate polysilicon layer 53 needs not be provided. The third portion 53c is provided in the gate polysilicon layer 53, thereby enabling the trenches 36 to be disposed so that ends thereof sandwiching the third portion 53c and facing each other along the first direction X are separated by a smaller distance.

For example, near the gate polysilicon layer 53, along a side of the gate polysilicon layer 53 parallel to the first direction X, a trench 36a (36) is disposed in a linear shape parallel to the first direction X. The third portion 53c is provided at the first portion 53a of the gate polysilicon layer 53 so as to sandwich the trench 36a (36). In other words, between the third portions 53c of the gate polysilicon layer 53 adjacent to each other along the first direction X, the trench 36a (36) is disposed in a linear shape extending parallel to the first direction X.

In this manner, the third portion 53c is provided to the gate polysilicon layer 53, thereby enabling ends of the trench 36a and of other trenches 36b (36), 36c (36) (i.e., the ends that substantially face each other across the third portion 53c of the gate polysilicon layer 53) and an outer peripheral portion of the first portion 53a of the gate polysilicon layer 53 to be disposed to face each other in the depth direction Z. In FIG. 6, the trenches 36a to 36c are indicated by a dashed line that is finer than a dashed line indicating the gate pad region 23 and the trenches 36 other than the trenches 36a to 36c are not depicted. Further, FIG. 6 depicts a state in which the ends of the adjacent trenches 36b, 36c are connected.

As depicted in FIG. 7, when a trench 36' is disposed in a striped shape extending along the second direction Y, the first portion 53a' of the gate polysilicon layer 53' has a planar shape in which at both ends of a side that is parallel to the second direction Y, a third portion 53c' that protrudes from the side is provided, and the third portion 53c' is not provided on a side parallel to the first direction X. In FIG. 7, similarly to the trench 36 depicted in FIG. 6, the trenches 36' (36a' to 36c') are indicated by a dashed line and the trenches 36' other than the trenches 36a' to 36c' are not depicted. Further, FIG. 7 depicts a state in which ends of the adjacent trenches 36b', 36c' are connected to each other.

The second embodiment may be applied to the third embodiment; and the first portions 53a, 53a' of the gate polysilicon layers 53, 53' may have a substantially ring-shaped planar shape.

As described above, according to the third embodiment, effects similar to the first and the second embodiments may be obtained. Further, according to the third embodiment, in the direction along which the trenches extend in a striped shape, the trenches may be disposed so that the ends thereof are closer to each other, thereby enabling reductions in the size of the semiconductor chip.

In the foregoing, the present invention is not limited to the embodiments described above and various modifications within a range not departing from the spirit of the invention are possible. For example, in the embodiments described above, while a case in which the planar outline of the gate polysilicon layer is similar to the planar outline of the gate pad has been described as an example, the peripheral edge of the gate pad may face the gate polysilicon layer in the depth direction, across the interlayer insulating film, or the planar outline of the gate polysilicon layer may be different from the planar outline of the gate pad. The present invention is not limited to a trench gate MOSFET and is further applicable to a trench gate IGBT. Further, the present invention is similarly implemented when conductivity types (n-type, p-type) are reversed.

According to the invention described above, the overall surface area of the gate polysilicon layer that is provided on the first main surface of the semiconductor substrate via an oxide film may be set relatively large. As a result, even when a large amount of charge due to ESD, etc. is injected in the gate pad, voltage applied to the oxide film beneath the gate polysilicon layer may be distributed, thereby enabling insulation breakdown of the oxide film to be suppressed. Further, according to the invention described, the peripheral edge of the gate pad faces the gate polysilicon layer in the depth direction, across the interlayer insulating film, whereby the unevenness between the gate pad and the front surface of the semiconductor substrate may be reduced and the described problems associated with the unevenness become less likely to occur.

The semiconductor device according to the present invention achieves an effect in that ESD capability and yield may be enhanced.

As described, the semiconductor device according to the present invention is useful for semiconductor devices in which gate resistance is connected in series between a gate pad and a gate electrode.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a gate electrode provided on a semiconductor substrate via a gate insulating film;
   a gate pad provided on a first main surface of the semiconductor substrate via an interlayer insulating film; and
   a gate polysilicon layer provided between the first main surface of the semiconductor substrate and the interlayer insulating film to face the gate pad across the interlayer insulating film, the gate polysilicon layer electrically insulated from the semiconductor substrate by an oxide film, wherein
   the gate pad is formed by a first portion and a second portion that is continuous with the first portion, and
   the gate polysilicon layer is formed by a first portion that faces the first portion of the gate pad, across the interlayer insulating film, and a second portion that is continuous with the first portion of the gate polysilicon layer and faces the second portion of the gate pad, across the interlayer insulating film, the second portion of the gate polysilicon layer being electrically connected between the second portion of the gate pad and the gate electrode, a surface area of the gate polysilicon layer covering an entire surface area of the gate pad viewed in a depth direction.

2. The semiconductor device according to claim 1, wherein
   the second portion of the gate polysilicon layer has a surface area that is smaller than a surface area of the first portion of the gate polysilicon layer.

3. The semiconductor device according to claim 2, wherein
   the first portion of the gate polysilicon layer has a rectangular planar shape, and
   the second portion of the gate polysilicon layer has a rectangular planar shape having the surface area that is smaller than the surface area of the first portion of the gate polysilicon layer, the rectangular planar shape being continuous with the first portion of the gate polysilicon layer so as to protrude from the first portion of the gate polysilicon layer.

4. The semiconductor device according to claim 2, wherein
   the first portion of the gate polysilicon layer has a ring-shaped planar shape facing a peripheral edge of the first portion of the gate pad in the depth direction, across the interlayer insulating film, and a planar outline that is larger than a planar outline of the first portion of the gate pad, and
   the second portion of the gate polysilicon layer has a planar shape continuous with the first portion of the gate polysilicon layer so as to protrude from the first portion of the gate polysilicon layer, and a planar outline that is larger than a planar outline of the second portion of the gate pad.

5. The semiconductor device according to claim 1, wherein
   the second portion of the gate pad has a surface area that is smaller than a surface area of the first portion of the gate pad.

6. The semiconductor device according to claim 5, wherein
   the first portion of the gate pad has a rectangular planar shape, and
   the second portion of the gate pad has a rectangular planar shape having a surface area that is smaller than a surface area of the first portion of the gate pad, the rectangular planar shape being continuous with the first portion of the gate pad so as to protrude from the first portion of the gate pad.

7. The semiconductor device according to claim 1, wherein
   the first portion of the gate polysilicon layer has a surface area that is larger than a surface area of the first portion of the gate pad.

8. The semiconductor device according to claim 1, wherein
   the second portion of the gate polysilicon layer has a surface area that is larger than a surface area of the second portion of the gate pad.

9. The semiconductor device according to claim 1, further comprising
   a metal layer electrically connected to the gate electrode, wherein
   the second portion of the gate polysilicon layer and the gate electrode are electrically connected through the metal layer.

10. The semiconductor device according to claim 1, wherein
    a peripheral edge of the gate pad faces the gate polysilicon layer in the depth direction, across the interlayer insulating film.

11. The semiconductor device according to claim 1, further comprising
    a trench gate structure including:
    a first semiconductor region of a second conductivity type provided in a surface layer of the first main surface of the semiconductor substrate of a first conductivity type;
    a second semiconductor region of the first conductivity type selectively provided in the first semiconductor region;
    a third semiconductor region of the first conductivity type, the third semiconductor region being a portion of the semiconductor substrate excluding the first semiconductor region;

a trench penetrating the second semiconductor region and the first semiconductor region, and reaching the third semiconductor region; and the gate electrode provided on the gate insulating film, in the trench;

a first electrode electrically connected to the first semiconductor region and the second semiconductor region; and a second electrode electrically connected to a second main surface of the semiconductor substrate, wherein the trench gate structure is disposed in a region of the semiconductor substrate excluding a region that faces the gate pad in the depth direction.

12. The semiconductor device according to claim 1, wherein the first portion of the gate polysilicon layer has a rectangular planar shape that at each end of a pair of opposing sides thereof, has a portion that protrudes from the ends.

13. A semiconductor device comprising:

a gate electrode provided on a semiconductor substrate via a gate insulating film;

a gate pad provided on a first main surface of the semiconductor substrate via an interlayer insulating film; and a gate polysilicon layer provided between the first main surface of the semiconductor substrate and the interlayer insulating film to face the gate pad overall in a depth direction across the interlayer insulating film, the gate polysilicon layer electrically insulated from the semiconductor substrate by an oxide film, wherein the gate pad is formed by a first portion and a second portion that is continuous with the first portion, the gate polysilicon layer is formed by a first portion that faces the first portion of the gate pad overall in the depth direction, across the interlayer insulating film, and a second portion that is continuous with the first portion of the gate polysilicon layer and faces the second portion of the gate pad overall in the depth direction, across the interlayer insulating film, the second portion of the gate polysilicon layer being electrically connected between the second portion of the gate pad and the gate electrode, and the first portion of the gate polysilicon layer has a ring-shaped planar shape facing a peripheral edge of the first portion of the gate pad in the depth direction, across the interlayer insulating film, and a planar outline that is larger than a planar outline of the first portion of the gate pad.

* * * * *